(12) United States Patent
Park et al.

(10) Patent No.: US 6,955,578 B2
(45) Date of Patent: Oct. 18, 2005

(54) METHOD OF VARYING TRANSMITTANCE OF TRANSPARENT CONDUCTIVE LAYER, FLAT PANEL DISPLAY DEVICE AND MANUFACTURING METHOD THEREOF

(75) Inventors: Sang-Il Park, Seoul (KR); Chang-Soo Kim, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 423 days.

(21) Appl. No.: 10/164,385

(22) Filed: Jun. 10, 2002

(65) Prior Publication Data

US 2003/0107326 A1 Jun. 12, 2003

(30) Foreign Application Priority Data

Nov. 29, 2001 (KR) .......................................... 2001-75075
Jan. 30, 2002 (KR) .......................................... 2002-5435

(51) Int. Cl.$^7$ .............................. H01J 9/04; F23Q 23/08
(52) U.S. Cl. .............................. 445/3; 445/46; 427/523; 427/526; 427/529; 427/530; 427/531
(58) Field of Search .................................. 427/523, 526, 427/529, 530, 531; 313/110, 112; 445/3, 46

(56) References Cited

U.S. PATENT DOCUMENTS 4,395,467 A * 7/1983 Vossen et al. .............. 428/697

* cited by examiner

*Primary Examiner*—Vip Patel
*Assistant Examiner*—Anthony Perry
(74) *Attorney, Agent, or Firm*—Stein, McEwen & Bui, LLP

(57) ABSTRACT

A method of varying a transmittance of a transparent conductive film includes forming the transparent conductive film on a substrate and injecting a high energy source into the transparent conductive film to vary the transmittance of the transparent conductive film.

12 Claims, 8 Drawing Sheets

METHOD OF VARYING TRANSMITTANCE OF TRANSPARENT CONDUCTIVE LAYER, FLAT PANEL DISPLAY DEVICE AND MANUFACTURING METHOD THEREOF

CROSS-REFERENCE TO RELATED APPLICATIONS

This application claims the benefit of Korean Patent Application No. 2001-75075 filed on Nov. 29, 2001 and Korean Patent Application No. 2002-5435 filed Jan. 30, 2002, in the Korean Industrial Property Office, the disclosures of which are incorporated herein by reference.

BACKGROUND OF THE INVENTION

1. Field of the Invention

The present invention relates to a transparent conductive film for use in a display device, and more particularly, to a method of varying a transmittance of a transparent conductive film. The present invention further relates to a flat panel display and a manufacturing method thereof.

2. Description of the Related Art

A transparent conductive film has an excellent transmittance of more than 80% and a high conductivity, and is used as, for example, a pixel electrode or a common electrode of a solar battery or a display device, such as a plasma display panel (PDP), a liquid crystal display (LCD), and an organic light emitting diode (OLED). The transparent conductive film plays a very important role in transmitting light to reproduce a color.

FIG. 1 shows a cross-sectional view illustrating a conventional organic electroluminescent (EL) display device having a transparent conductive film as a pixel electrode.

An insulating substrate 500 having first and second regions 501 and 502 is provided. A pixel will be formed on the first region 501, and a thin film transistor (TFT) and a storage capacitor will be formed on the second region 502.

A buffer layer 520 is formed on the insulating substrate 500. A semiconductor layer 530 is formed on a portion of the buffer layer 520 over the second region 502. A gate insulating layer 540 is formed over the entire surface of the substrate 500. A gate electrode 551 is formed on a portion of the gate insulating layer 540 over the semiconductor layer 530. A lower capacitor electrode 552 is formed at the same time as the gate electrode 551.

An n-type impurity or a p-type impurity is ion-doped to form source and drain regions 531 and 532. A portion 533 of the semiconductor layer 530 between the source and drain regions 531 and 532 serves as a channel region.

An interlayer insulating layer 560 is formed over the entire surface of the substrate 500. The gate insulating layer 540 and the interlayer insulating layer 560 are simultaneously etched to expose portions of the source and drain regions 531 and 532, thereby forming contact holes 561 and 562.

Next, source and drain electrodes 571 and 572 are formed on the interlayer insulating layer 560 to contact the source and drain regions 531 and 532, respectively. At the same time, an upper capacitor electrode 573 is formed to connect either of the source and drain electrodes 571 and 572. In FIG. 1, the upper capacitor electrode 573 is connected to the source electrode 571. A portion of the interlayer insulating layer 560 formed over the lower capacitor electrode 522 serves as a dielectric layer of the capacitor.

Subsequently, a passivation film 580 is formed on the interlayer insulating layer 560. The passivation film 580 is etched to expose either of the source and drain electrodes 571 and 572, thereby forming a via hole 581. In FIG. 1, the via hole 581 exposes a portion of the drain electrode 572.

Thereafter, a transparent conductive film made of, e.g., indium tin oxide (ITO) is deposited on the passivation film 580 and patterned to thereby form a pixel electrode 590 (i.e., anode electrode) over the first region 501. The pixel electrode 590 is electrically connected to the drain electrode 572 through the via hole 581.

Subsequently, a planarization layer 600 is formed over the entire surface of the substrate 500, and is patterned to form an opening portion 610. The opening portion 610 exposes a portion of the anode electrode 590.

An organic EL layer 620 is formed on the exposed portion of the anode electrode 590. A cathode electrode 630 is formed to cover the organic EL layer 620, thereby completing the conventional organic EL display device.

A flat panel display device such as an active matrix organic EL display device described above includes a switching element and wire lines which are used to apply electrical power to the switching element. Ambient light is reflected from the wire lines made of a metal, and thus a contrast ratio is lowered. In other words, the ambient light is reflected from the lower and upper capacitor electrodes, the source and drain electrodes and the cathode electrode.

A polarizer can be arranged to prevent the contrast ratio from being lowered. However, the cost of incorporating the polarizer is high, increasing the overall manufacturing cost of the organic EL display device. In addition, the polarizer shields light emitted from the organic EL layer 620 and thus lowers a transmittance, leading to a low brightness.

Alternatively, a black matrix made of Cr/CrOx or an organic material can be formed over the rest of the second region 502 except for the first region 501 to prevent the contrast ratio from being lowered. However, this requires an additional mask process to form the black matrix. In addition, with an increase (deepening) of a step difference between the first and second regions 501 and 502, a short circuit between the gate electrode 551 and the source and drain electrodes 531 and 532 may occur.

SUMMARY OF THE INVENTION

Accordingly, it is an object of the present invention to provide a flat panel display device having a high contrast and an improved manufacturing method thereof.

Additional objects and advantages of the invention will be set forth in part in the description which follows and, in part, will be obvious from the description, or may be learned by practice of the invention.

To achieve the above and other objects according to an embodiment of the present invention, there is provided a method of varying a transmittance of a transparent conductive film, the method comprising forming the transparent conductive film on a substrate and injecting a high energy source into the transparent conductive film to vary the transmittance of the transparent conductive film.

The high energy source is, for example, an accelerated ion. The accelerated ion may include one of H, P, B, As, and Ar. The high energy source is injected at, for example, energy of 40 keV to 100 keV. The high energy source is injected at different energy levels at least one time. The high energy source is injected by a dosage amount of, for example, $3 \times 10^{15}$ ions/cm$^2$ to $2 \times 10^{16}$ ions/cm$^2$. The transparent conductive film may include one of ITO, indium oxide (IO), tin oxide (TO), indium zinc oxide (IZO), and zinc oxide (ZNO), and have a thickness of 400 Å to 4000 Å.

According to another embodiment of the present invention, a method of varying a transmittance of a transparent conductive film comprises forming the transparent conductive film on a substrate, forming a mask on the transparent conductive film to expose a portion of the transparent conductive film, and injecting a high energy source into the exposed portion of the transparent conductive film to vary the transmittance of the transparent conductive film.

The high energy source is injected at energy of, for example, 40 keV to 100 keV. The mask includes one of a photoresist film, an insulating film, and a conductive film.

According to yet another embodiment of the present invention, there is provided a method of manufacturing a flat panel display device, the method comprising providing an insulating substrate ("substrate") having first and second regions, forming a pixel electrode and a black matrix on the first and second regions, respectively, using a half-tone mask, forming an insulating layer over the entire surface of the substrate, forming a thin film transistor being electrically connected to the pixel electrode on a region corresponding to the black matrix, forming a planarization layer over the entire surface of the substrate, and forming an opening portion to expose a portion of the pixel electrode.

The forming the pixel electrode and the black matrix comprises forming a transparent conductive film on the entire surface of the substrate, coating a photosensitive film on the transparent conductive film, patterning the photosensitive film to form first and second photosensitive patterns over the first and second regions, respectively, wherein the first photosensitive pattern has a thickness thicker than the second photosensitive pattern, etching the transparent conductive film using the first and second photosensitive patterns to form first and second transparent conductive patterns, ion-doping an impurity into the second transparent conductive pattern, thereby forming the black matrix, wherein the first photosensitive pattern acts as a mask to prevent the ion-doping of the impurity into the second transparent conductive pattern, and removing the remainder of the first photosensitive pattern, thereby forming the pixel electrode.

The impurity is ion-doped at energy of, for example, 40 keV to 100 keV for at least one time.

According to still another embodiment of the present invention, a method of manufacturing a flat panel display device comprises providing an insulating substrate having first and second regions, forming a transparent conductive film on the entire surface of the substrate, forming a photosensitive film to expose a portion of the transparent conductive film corresponding to the second region of the substrate, ion-doping an impurity into the exposed portion of the transparent conductive film using the photosensitive film as a mask, thereby forming a black matrix, forming a first insulating layer over the entire surface of the substrate, forming a thin film transistor on a portion of the first insulating layer corresponding to the black matrix; forming a second insulating layer over the entire surface of the substrate, forming a pixel electrode being electrically connected to the thin film transistor on a portion of the second insulating layer corresponding to the first region of the substrate, forming a third insulating layer over the entire surface of the substrate; and forming an opening portion to expose a portion of the pixel electrode.

The impurity is ion-doped at an energy of, for example, 40 keV to 100 keV for at least one time.

According to an additional embodiment of the present invention, there is provided a flat panel display device comprising an insulating substrate having first and second regions and a transparent conductive film having first and second patterns, wherein the first pattern formed over the first region serves as a pixel electrode and the second pattern formed over the second region serves as a black matrix.

A transmittance of the second pattern of the transparent conductive film is varied by an ion-doping operation. The first and second patterns of the transparent conductive film may be separated from each other or may be integrally connected to each other.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
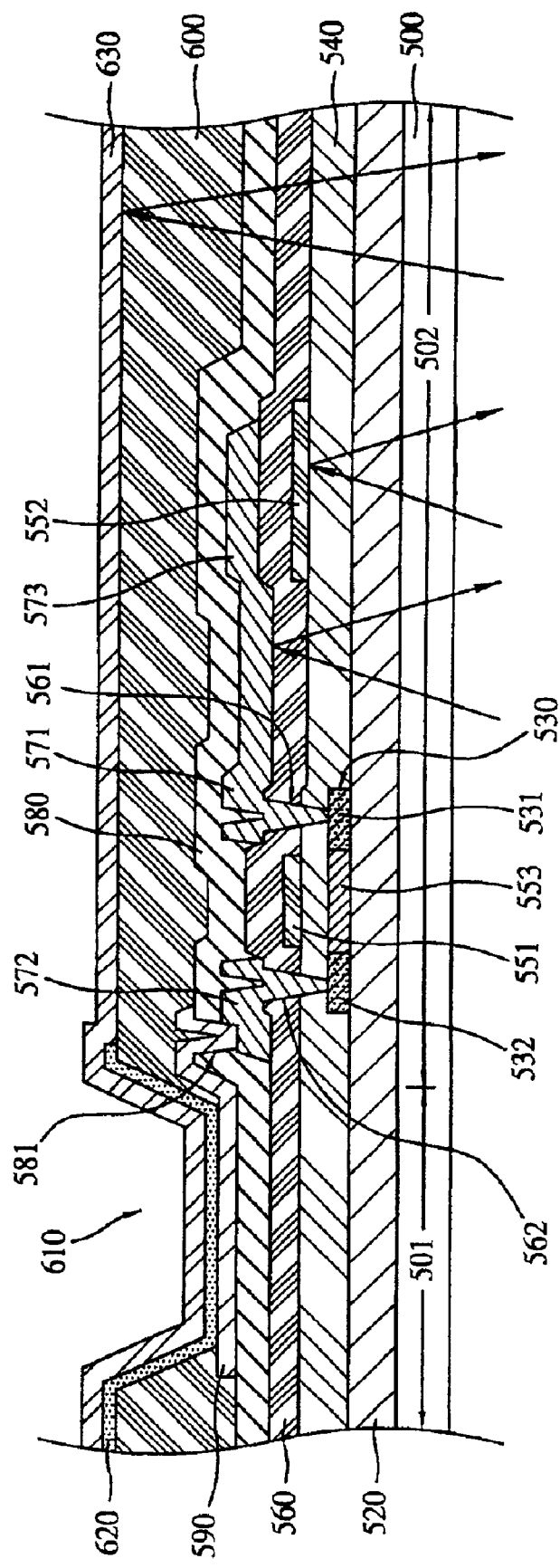
FIG. 1 is a cross-sectional view illustrating a conventional organic EL display device having a transparent conductive film as a pixel electrode.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2A:
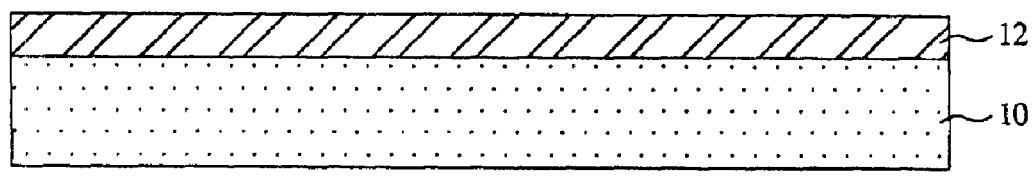
FIGS. 2A and 2B are cross-sectional views illustrating a method of varying a transmittance of a transparent conductive film according to an embodiment of the present invention.
Figure 2B:
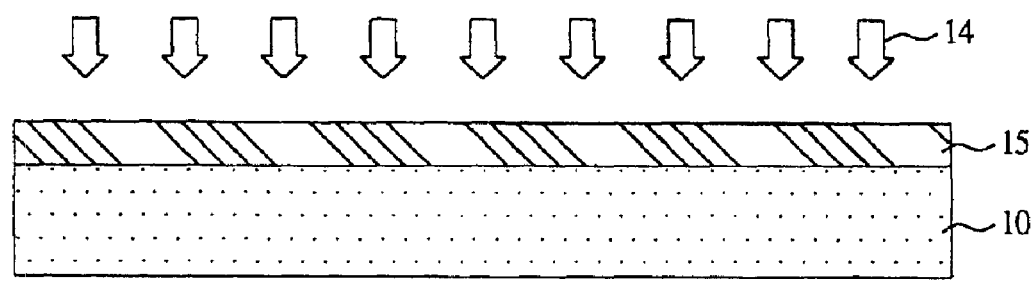

FIGS. 2A and 2B show cross-sectional views illustrating a method of varying a transmittance of a transparent conductive film 12 according to an embodiment of the present invention.

The transparent conductive film 12 is formed on a substrate 10 as shown in FIG. 2A. An impurity 14 accelerated by a high energy is ion-doped into the transparent conductive film 12 to vary the transmittance as shown in FIG. 2B. That is, a transparent conductive film 15 having, for example, a low transmittance is obtained.

Here, the impurity 14 such as H, P, B, As, or Ar is accelerated by the high energy of 40 keV to 100 keV, and is ion-doped using, for example, an ion implanter or an ion shower. A dosage amount of the impurity 14 is in a range between $3\times10^{15}$ ions/cm$^2$ and $2\times10^{16}$ ions/cm$^2$. The transparent conductive film 12 has a thickness of 400 Å to 4000 Å, and is made of one of indium tin oxide (ITO), indium oxide (IO), tin oxide (TO), indium zinc oxide (IZO), or zinc oxide (ZnO).

Figure 3:
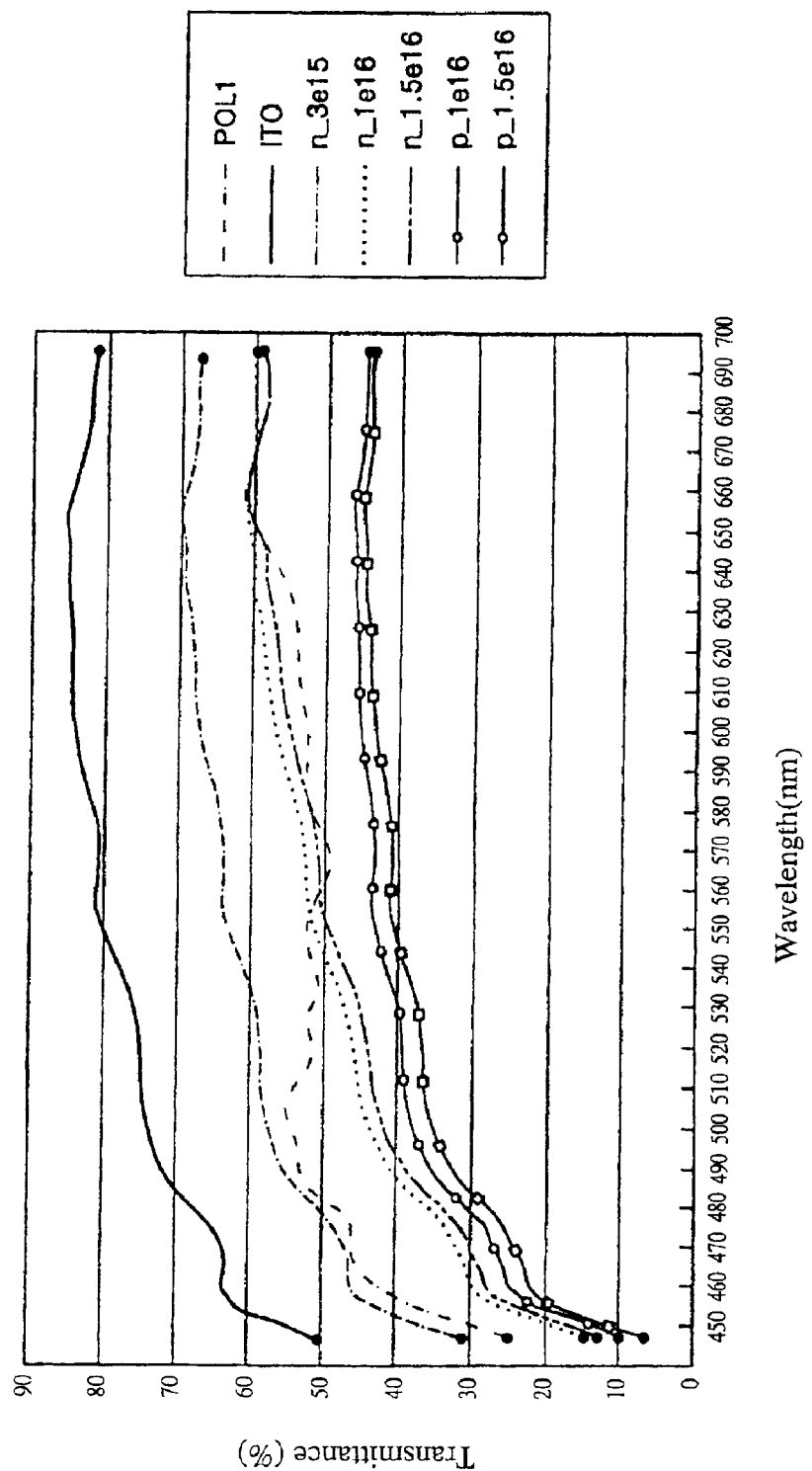
FIG. 3 is a graph illustrating a transmittance of the transparent conductive film according to a dosage amount of an ion-doped impurity.

FIG. 3 shows a graph illustrating a transmittance of a transparent conductive film according to a dosage amount of an ion-doped impurity. The transmittance of the transparent conductive film is varied when the impurity is ion-doped. As shown in FIG. 3, a polarizing plate (e.g., $\lambda/4$ plate) has a transmittance of 40%, whereas the transparent conductive film ion-doped by the impurity having a dosage amount of $1.5\times10^{16}$ ions/cm$^2$ has a transmittance of 30%.

The transmittance of the transparent conductive film is varied by the ion-doping of the impurity because oxygen comes off due to a bombardment of the accelerated impurity during the ion-doping operation. In other words, since the oxygen comes off the transparent conductive film, a metal composition of the transparent conductive film is relatively increased, thereby lowering the transmittance of the transparent conductive film.

Figure 4:
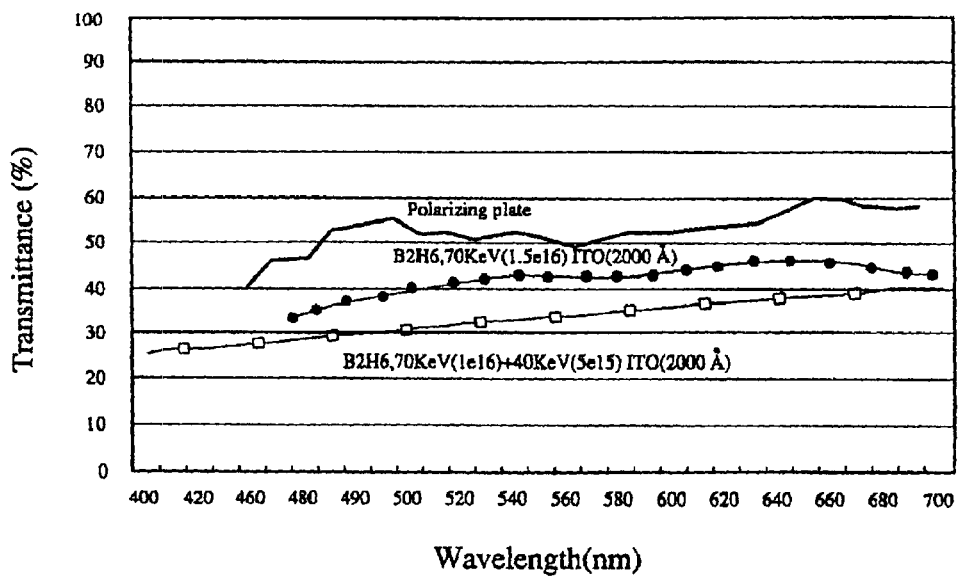
FIG. 4 is a graph illustrating a transmittance of the transparent conductive film according to an ion-doping method.

FIG. 4 shows a graph illustrating a transmittance of a transparent conductive film according to an ion-doping method. As shown in FIG. 4, where accelerated ions accelerated by different energy are ion-doped repeatedly, a transmittance of the transparent conductive film can be lowered even more.

For example, a transparent conductive film (i.e., ITO having a thickness of 2000 Å) which is: 1) ion-doped by $B_2H_6$ having a dosage amount of $1.0\times10^{16}$ ions/cm$^2$ at energy of 70 keV; and 2) ion-doped again by $B_2H_6$ having a dosage amount of $0.5\times10^{16}$ ions/cm$^2$ at energy of 40 keV has a lower transmittance than the same transparent conductive film being ion-doped once by $B_2H_6$ having a dosage amount of $1.5\times10^{16}$ ions/cm$^2$ at an energy of 70 keV.

Here, the total dosage amount ($1.0\times10^{16}$ ions/cm$^2$+$0.5\times10^{16}$ ions/cm$^2$) of the ion-doping method under 1) and 2) above is set to be equal to the dose amount ($1.5\times10^{16}$ ions/cm$^2$) of the one-time ion-doping method.

Figure 5:
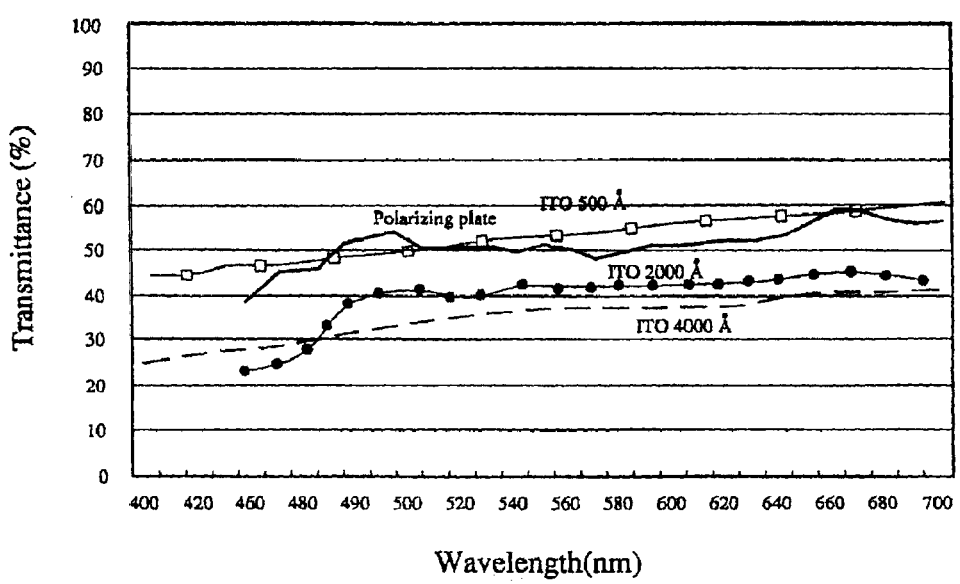
FIG. 5 is a graph illustrating a transmittance of the transparent conductive film according to a thickness of the transparent conductive film.

FIG. 5 shows a graph illustrating a transmittance of a transparent conductive film according to a thickness of the transparent conductive film. As shown in FIG. 5, as the thickness of the transparent conductive film is increased, the transmittance of the transparent conductive film is lowered.

Figure 6:
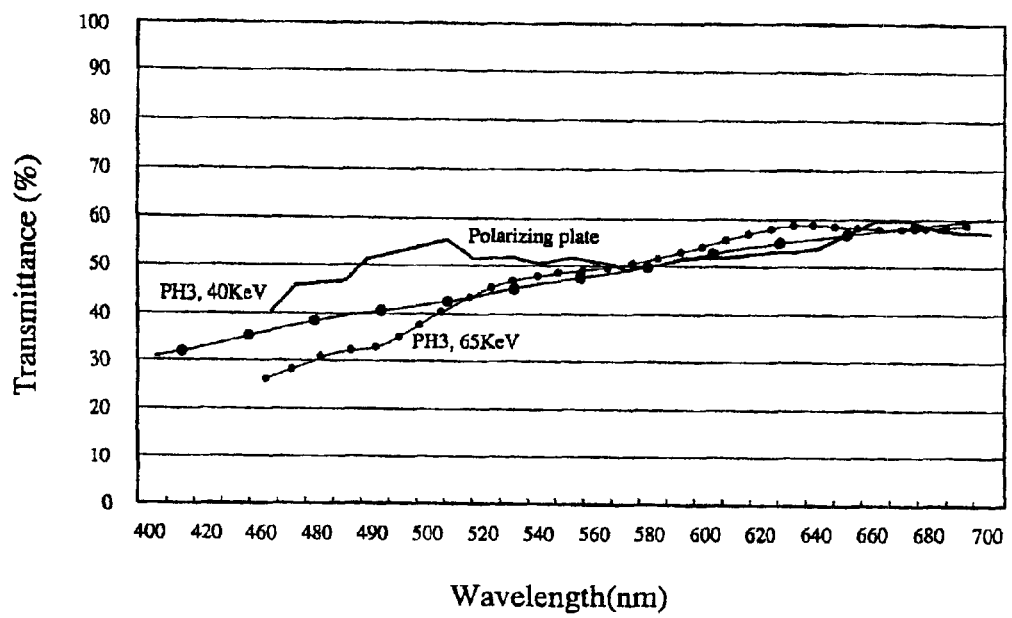
FIG. 6 is a graph illustrating a transmittance of the transparent conductive film according to an ion-doping energy.

FIG. 6 shows a graph illustrating a transmittance of a transparent conductive film according to an ion-doping energy used. As shown in FIG. 6, where the ion-doping energy is more than 40 keV, the transmittance of the transparent conductive film is lower than that of a polarizing plate.

Figure 7:
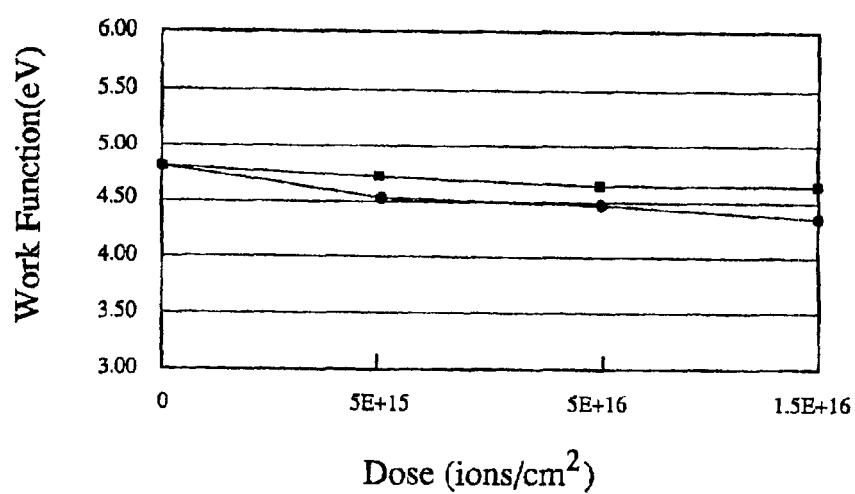
FIG. 7 is a graph illustrating a work function of the transparent conductive film according to a dosage amount of the impurity.

FIG. 7 shows a graph illustrating a work function of a transparent conductive film according to a dosage amount of an impurity. As shown in FIG. 7, as the dosage amount of the impurity is reduced, the work function of the transparent conductive film is decreased. This is because oxygen of the transparent conductive film reacts with the accelerated ion and thus an oxygen content of the transparent conductive film is reduced.

Figure 8A:
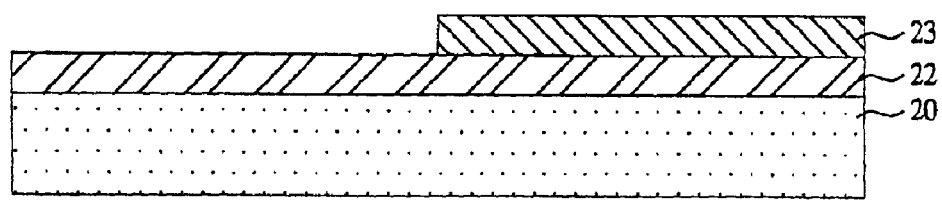
FIGS. 8A and 8B are cross-sectional views illustrating a method of varying a transmittance of the transparent conductive film according to another embodiment of the present invention.
Figure 8B:
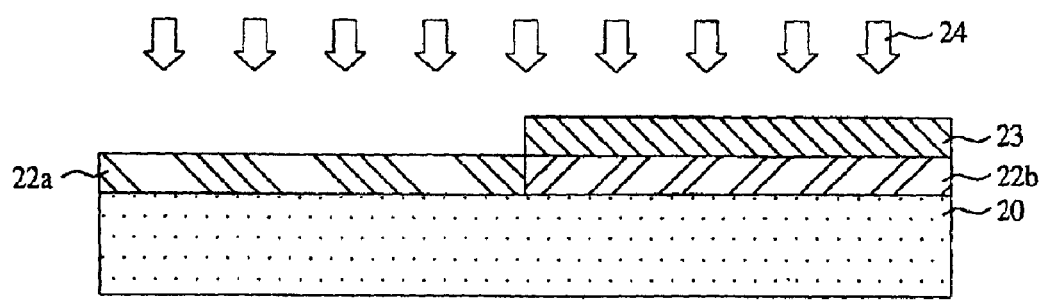

FIGS. 8A and 8B show cross-sectional views illustrating a method of varying a transmittance of a transparent conductive film 22 according to another embodiment of the present invention.

Referring to FIG. 8A, the transparent conductive film 22 is formed on a substrate 20. A mask 23 is formed on the transparent conductive film 22 to expose a portion of the transparent conductive film 22, wherein a transmittance will be varied.

Referring to FIG. 8B, an impurity 24 accelerated by high energy is ion-doped into the exposed portion of the transparent conductive film 22. As a result, the transparent conductive film 22 has a doped portion 22a and a non-doped region 22b. The doped portion 22a of the transparent conductive film 22 has a transmittance lower than the non-doped region 22b.

Here, the impurity 40 such as H, P, B, As, or Ar is accelerated by the high energy of 40 keV to 100 keV, and is ion-doped by using an ion implanter or an ion shower. A dosage amount of the impurity 40 is in a range between $3\times10^{15}$ ions/cm$^2$ and $2\times10^{16}$ ions/cm$^2$.

The mask 23 is made of one of a photosensitive film, an insulating film, a conductive film, or any kind of material which can shield the impurity from being ion-doped into the non-doped region 22b of the transparent conductive film 22.

The non-doped region 22b of the transparent conductive film 22 serves as a pixel electrode or a common electrode of a display device, and the doped portion 22a of the transparent conductive film 22 serves as a black matrix.

Hereinafter, a method of manufacturing a flat panel display device according to the present invention is described focusing on an organic EL display device.

FIGS. 9A to 9D show cross-sectional views illustrating a method of manufacturing an organic EL display device according to yet another embodiment of the present invention.

Figure 9A:
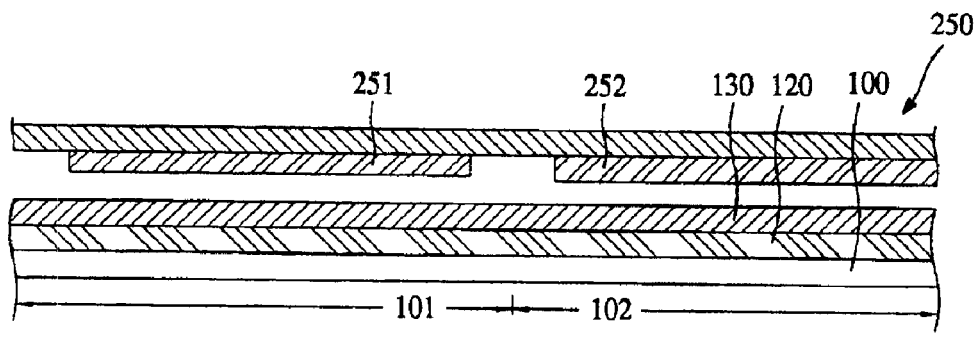
FIGS. 9A to 9D are cross-sectional views illustrating a method of manufacturing an organic EL display device according to yet another embodiment of the present invention.
Figure 9B:
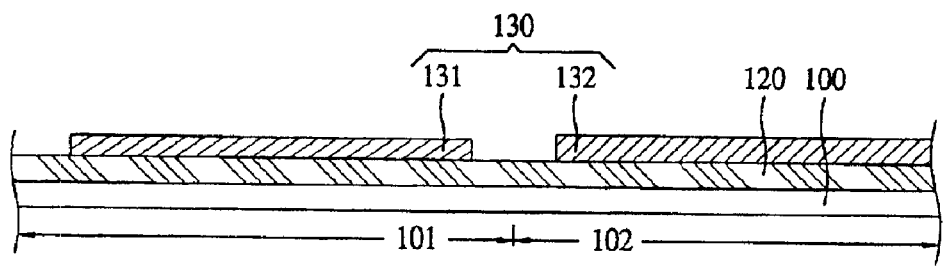

Referring to FIG. 9A, a transparent insulating substrate ("substrate") 100 having first and second regions 101 and 102 is provided. The first region 101 is a region in which, for example, a thin film transistor (TFT) and a capacitor will be formed. The second region 102 is a region in which an organic EL element will be formed.

A transparent conductive film 120 is formed on the substrate 100. A photosensitive film 130 is coated on the transparent conductive film 120. The photosensitive film 130 is made of, for example, one of photoresist, benzocyclobuten (BCB), polyimides (PI), and acryl.

The photosensitive film 130 is patterned using a half-tone mask 250 to form a first photosensitive pattern 131 and a second photosensitive pattern 132 as shown in FIG. 8B.

The half-tone mask 250 includes a semi-transmitting portion 251 and a light shielding portion 252. The rest of the half-tone mask 250 except for the semi-transmitting portion 251 and the light-shielding portion 252 is a light transmitting portion. The semi-transmitting portion 251 is formed at a location corresponding to a black matrix which will be formed in an operation to be described later. The light shielding portion 252 is formed at a location corresponding to a pixel electrode which will be formed in an operation to be described later.

The second photosensitive pattern 132 formed over the second region 102 of the substrate 100 has the same thickness as the photosensitive film 130, whereas the first photosensitive pattern 131 formed over the first region 101 has a thickness thinner than the photosensitive film 130.

Figure 9C:
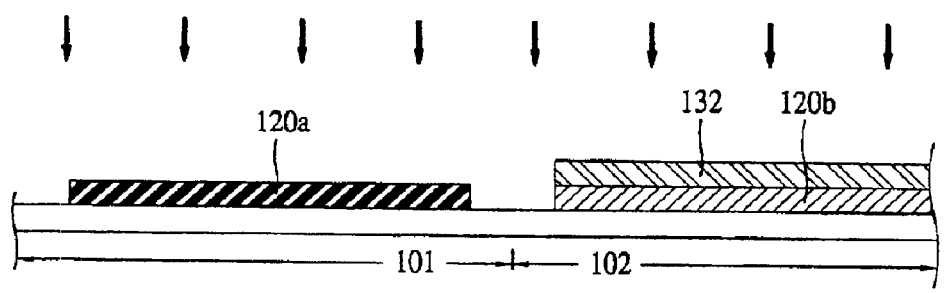

Referring to FIG. 9C, the transparent conductive film 120 is patterned using the first and second photosensitive patterns 131 and 132 as a mask, thereby forming first and second transparent conductive patterns 120a and 120b. At this point, nothing remains on the first transparent conductive film 120a, but the second photosensitive pattern 132 is not removed and remains on the second transparent conductive film 120b.

Subsequently, an impurity is accelerated by high energy of 40 keV to 100 keV and is ion-doped into the first and second transparent conductive films 120a and 120b. However, since the second photosensitive pattern 132 serves as a mask, the impurity is ion-doped into only the first transparent conductive film 120a. Here, the ion-doping process may be repeatedly performed to lower the transmittance of the first transparent conductive film 120a to a desired level.

Consequently, since an oxygen content of the first transparent conductive film 120a is reduced, the transmittance of the first transparent conductive film 120a is varied, and thus a refractive index is varied, so as to have the first transparent conductive film 120a serve as a black matrix which prevents a light reflection caused by metal lines of the organic EL display device.

However, the transmittance of the second transparent conductive film 120b is not varied. Therefore, the second transparent conductive film 120b serves as a pixel electrode.

Figure 9D:
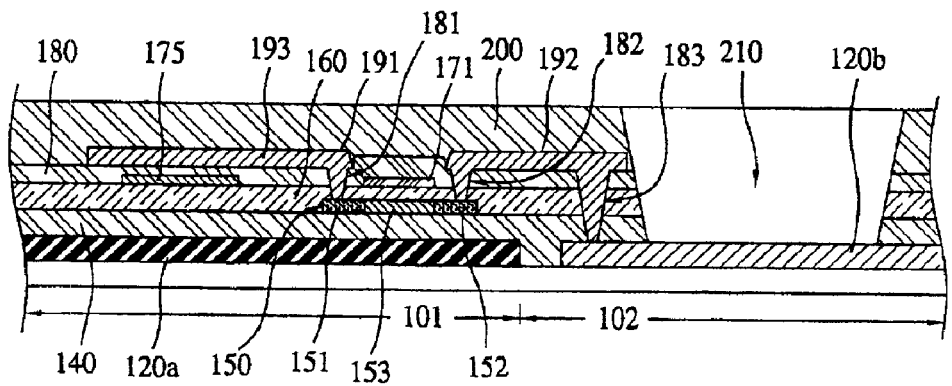

Referring to FIG. 9D, a buffer layer 140 is formed over the entire surface of the substrate 100. A semiconductor layer 150 is formed on a portion of the buffer layer 140 over the first region 101 of the substrate 100. A gate insulating layer 160 is formed over the entire surface of the substrate 100.

A gate electrode 171 is formed on a portion of the gate insulating layer 160 over the semiconductor layer 150. At the same time, a lower capacitor electrode 175 is formed over the first region 101 of the substrate 100. Using the gate electrode as a mask, an n-type impurity or a p-type impurity is ion-doped into the semiconductor layer 150 to form source and drain regions 151 and 152. Here, a portion 153 of the semiconductor layer 150 between the source and drain regions 151 and 152 serves as a channel area.

An interlayer insulating layer 180 is formed over the entire surface of the substrate 100. First to third contact holes 181 to 183 are formed to expose portions of the source and drain regions 151 and 152 and a portion of the pixel electrode 120b, respectively.

A metal layer is deposited on the interlayer insulating layer 180 and patterned to form source and drain electrodes 191 and 192 and an upper capacitor electrode 193. The source electrode 191 is electrically connected to the source region 151 via the first contact hole 181. The drain electrode 192 is electrically connected to the drain region 152 and the pixel electrode 120b via the second and third contact holes 182 and 183, respectively. The upper capacitor electrode 193 is connected to the source electrode 191.

A planarization layer 200 is formed. An opening portion 210 is formed to expose a portion of the pixel electrode 120b. Thereafter, even though not shown, an organic EL layer is formed on the exposed portion of the pixel electrode 120b, and a cathode electrode is formed to cover the organic EL layer.

As described above, the method of manufacturing the organic EL display device according to the present invention only requires six masking operations, and thus the manufacturing process is simplified. In addition, layers through which light emitted from the organic EL layer passes are reduced, and the black matrix is formed on the rest of the region except for the pixel region 102, thereby increasing a contrast ratio and brightness.

It is understood that the half-tone mask can be designed to include only the semi-transmitting portion and the light shielding portion. In this case, the black matrix and the pixel electrode are not separated and connected to each other, thereby preventing an occurrence of a step portion of the transparent conductive film.

Figure 10A:
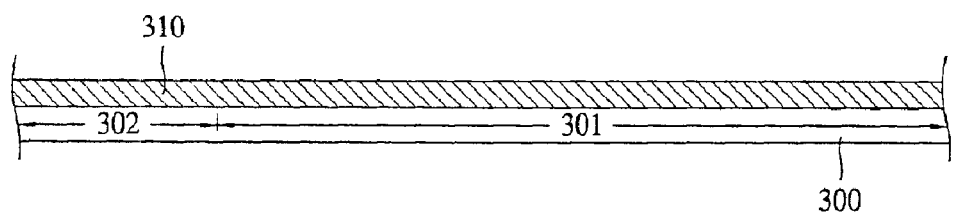
FIGS. 10A to 10C are cross-sectional views illustrating a method of manufacturing an organic EL display device according to still another embodiment of the present invention.
Figure 10B:
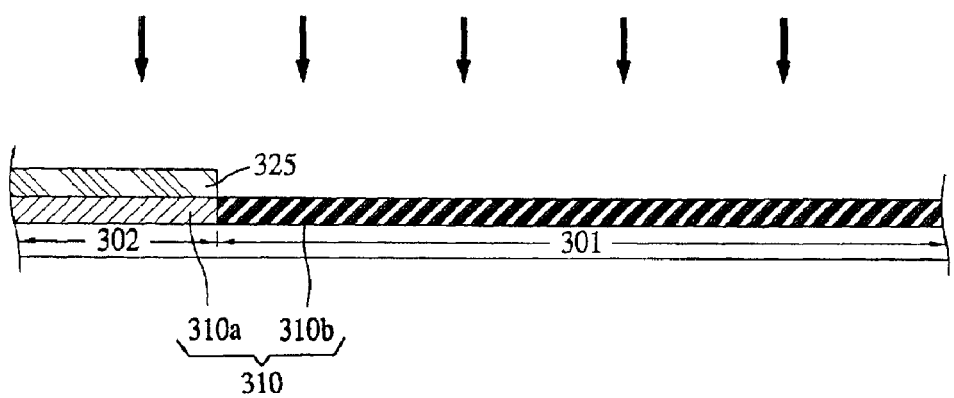
Figure 10C:
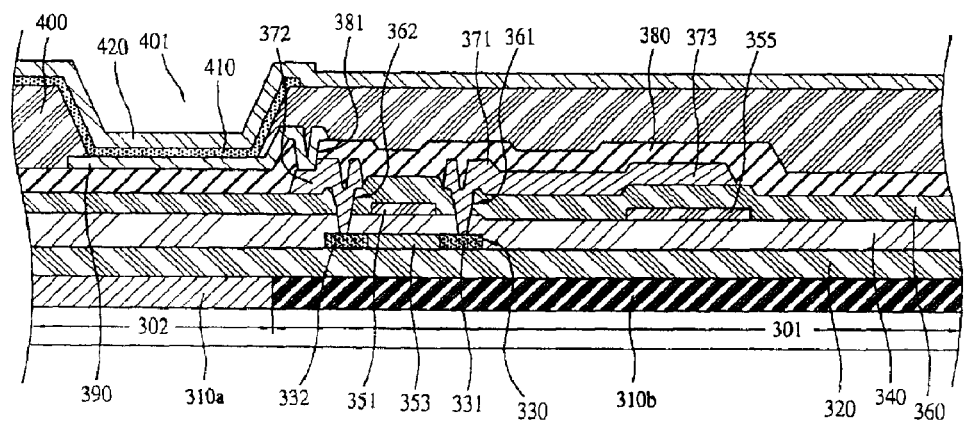

FIGS. 10A to 10C show cross-sectional views illustrating a method of manufacturing an organic EL display device according to still another embodiment of the present invention.

Referring to FIG. 10A, a transparent insulating substrate 300 having first and second regions 301 and 302 is provided. The first region 301 is a region in which a thin film transistor (TFT) and a capacitor will be formed. The second region 302 is a region in which an organic EL element will be formed. A transparent conductive film 310 is formed on the substrate 300.

A photosensitive film 325 is coated on the transparent conductive film 310 and is patterned to expose a portion of the transparent conductive film 310 over the first region 301 of the substrate 300 as shown in FIG. 10B.

An impurity (shown by arrows in FIG. 10B) is accelerated by high energy and is ion-doped into the transparent conductive film 310, thereby forming a black matrix. That is, a non-doped portion 310a of the transparent conductive film 310 serves, for example, to transmit light emitted from an organic El layer which will be formed in an operation to be described later, and a doped portion 310b of the transparent conductive film 310 serves as the black matrix. The ion-doping process is performed by the same operation as described above.

Referring to FIG. 10C, a buffer layer 320 is formed over the entire surface of the substrate 300. A semiconductor layer 330 is formed on a portion of the buffer layer 320 over the first region 301 of the substrate 300. A gate insulating layer 340 is formed over the entire surface of the substrate 300.

A gate electrode 351 is formed on a portion of the gate insulating layer 340 over the semiconductor layer 330. At the same time, a lower capacitor electrode 355 is formed over the first region 301 of the substrate 300. Using the gate electrode 351 as a mask, an n-type impurity or a p-type impurity is ion-doped into the semiconductor layer 330 to form source and drain regions 331 and 332. Here, a portion 353 of the semiconductor layer 330 between the source and drain regions 331 and 332 serves as a channel area.

An interlayer insulating layer 360 is formed over the entire surface of the substrate 300. First and second contact holes 361 and 362 are formed to expose portions of the source and drain regions 331 and 332.

A metal layer is deposited on the interlayer insulating layer 360 and patterned to form source and drain electrodes 371 and 372 and an upper capacitor electrode 373. The source electrode 371 is electrically connected to the source region 331 via the first contact hole 361. The drain electrode 372 is electrically connected to the drain region 332 via the second contact hole 362. The upper capacitor electrode 373 is connected to the source electrode 371.

A passivation film 380 is formed over the entire surface of the substrate 300. A via hole is formed to expose a portion of the drain electrode 372. A pixel electrode 390 is formed on a portion of the passivation film 380 over the second region 302 of the substrate 300 and is electrically connected to the drain electrode 372 via the contact hole 381.

A planarization layer 400 is formed over the entire surface of the substrate 300. An opening portion 401 is formed to expose a portion of the pixel electrode 390. An organic EL layer 410 is formed on the exposed portion of the pixel electrode 390, and a cathode electrode 420 is formed to cover the organic EL layer 390.

While the black matrix is formed before the buffer layer 320, it is understood that the black matrix can be formed after the buffer layer 320.

As described above, a transmittance of a portion of a transparent conductive film can be varied through an ion-doping operation to provide a black matrix while providing for a common electrode or a pixel electrode.

Since the pixel electrode and the black matrix can be simultaneously formed using one masking operation, the overall manufacturing process is simplified, leading to a high manufacturing yield. In addition, a light reflection is prevented without using a high cost polarizing plate, leading to a low manufacturing cost and a high brightness.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of varying a transmittance of a transparent conductive film, the method comprising:
    forming the transparent conductive film on a substrate; and
    injecting a high energy source into the transparent conductive film to vary the transmittance of the transparent conductive film;
    wherein the high energy source is injected at a different energy at least once.

2. The method of claim 1, wherein the high energy source is an accelerated ion.

3. The method of claim 2, wherein the accelerated ion includes one of H, P, B, As, and Ar.

4. The method of claim 2, wherein the high energy source is injected at an energy of 40 keV to 100 keV.

5. The method of claim 2, wherein the high energy source is injected by a total dosage amount of $3\times10^{15}$ ions/cm$^2$ to $2\times10^{16}$ ions/cm$^2$.

6. The method of claim 5, wherein the injecting of the high energy source comprises injecting a portion of the total dosage amount at one energy of 40 keV to 100 keV, and injecting another portion of the total dosage amount at a different energy of 40 keV to 100 keV.

7. The method of claim 1, wherein the transparent conductive film includes one of indium tin oxide (ITO), indium oxide (IO), tin oxide (TO), indium zinc oxide (IZO), and zinc oxide (ZnO).

8. The method of claim 7, wherein the transparent conductive film has a thickness of 400 Å to 4000 Å.

9. The method of claim 1, further comprising forming a mask on the transparent conductive film to expose a portion of the transparent conductive film.

10. The method of claim 9, wherein the mask includes one of a photoresist film, an insulating film, and a conductive film.

11. The method of claim 1, wherein:
    the transparent conductive film includes a metal composition content and an oxygen content, and
    the injecting of the high energy source into the transparent conductive film reduces the oxygen content of the transparent conductive film.

12. The method of claim 1, wherein the transmittance of the transparent conductive film is further varied by varying a thickness of the transparent conductive film on the substrate.

\* \* \* \* \*